United States Patent [19]

Kornowski et al.

[11] Patent Number: 5,248,848

[45] Date of Patent: Sep. 28, 1993

[54] REFLOW COMPATIBLE DEVICE PACKAGE

[75] Inventors: Robert R. Kornowski, Schaumburg; Carl Missele, Elgin, both of Ill.

[73] Assignee: Motorola, Inc., Schaumburg, Ill.

[21] Appl. No.: 355,572

[22] Filed: May 22, 1989

[51] Int. Cl.$^5$ .............................................. H05K 5/03
[52] U.S. Cl. ............................... 174/52.1; 174/17 VA; 220/DIG. 27
[58] Field of Search ............... 174/17 VA, 52.1, 52.5; 220/373, 374, DIG. 27

[56] References Cited

U.S. PATENT DOCUMENTS

| | | | |
|---|---|---|---|
| 4,486,622 | 12/1984 | Dathe et al. | 174/52.5 |
| 4,550,273 | 10/1985 | Boettcher et al. | 315/151 |
| 4,572,210 | 2/1986 | McKinnon | 128/765 |
| 4,574,874 | 3/1986 | Duran | 55/181 |
| 4,618,071 | 10/1986 | Vincent | 220/373 X |
| 4,744,240 | 5/1988 | Reichelt | 73/38 |
| 4,921,124 | 5/1990 | Stammler | 220/367 |
| 4,955,992 | 9/1990 | Goodale et al. | 55/160 |
| 4,974,745 | 12/1990 | Jocham | 220/371 |
| 4,980,550 | 12/1990 | Port | 250/255 |

FOREIGN PATENT DOCUMENTS 0039869  11/1981  European Pat. Off. .

*Primary Examiner*—Leo P. Picard
*Assistant Examiner*—D. A. Tone
*Attorney, Agent, or Firm*—Steven G. Parmelee; John W. Hayes

[57] ABSTRACT

An electronic device package includes a portion that functions as a membrane to allow small molecules, such as gas molecules, to relatively freely traverse the housing boundary, while simultaneously substantially preventing large molecules, such as liquid molecules, from entering the confines of the housing. As a result, the package can be readily used in reflow processing without risking damage to the boundary integrity between the housing and the support surface that supports both the electronic device and the housing.

3 Claims, 1 Drawing Sheet

REFLOW COMPATIBLE DEVICE PACKAGE

TECHNICAL FIELD

This invention relates generally to electronic device packaging, and particularly to reflow process compatible packages.

BACKGROUND OF THE INVENTION

Many electronic devices, such as power transistors, require housings for protection and ease of use during subsequent manufacturing. A power transistor housing typically includes a support surface and a housing coupled to the support surface with an appropriate adhesive, such as epoxy. Typically, the adhesive must be cured, such as by heating. During this curing process, however, or later during reflow processing, the atmospheric contents (A) (see FIG. 2) of the housing (B) expand. As a result of this expansion, the atmospheric contents (A) can overcome the resistance of the adhesive material (C) (FIG. 3) and produce a rupture therethrough. This rupture can then provide a pathway for larger molecules (D) (FIG. 4), such as molten solder or flux, all of which can damage the operability of the transistor located within the housing.

A need exists for a reflow compatible device package and method.

SUMMARY OF THE INVENTION

This need is substantially met through provision of the reflow compatible device package disclosed herein. This package functions to contain an electronic device, and includes a support surface for supporting the electronic device and a housing for disposition about the electronic device. The housing couples to the support surface through use of an appropriate attachment medium, such as an adhesive. The attachment medium is substantially resistant to the passage of gas therethrough. The housing includes at least a portion thereof that is less resistant to the passage of gas than is the attachment medium, but that is still substantially resistant to the passage of liquid therethrough.

As a result, the atmospheric contents of the housing can safely vent through the housing during various processing modes, without endangering the physical integrity of the attachment medium. At the same time, liquids, such as solder or flux, are prevented from entering the housing and contaminating the operation of the transistor.

In one embodiment, the housing can be comprised of ceramic material, wherein a portion of the ceramic material is comprised of porous ceramic material to allow the appropriate desired permeability.

BEST MODE FOR CARRYING OUT THE INVENTION

Figure 1:
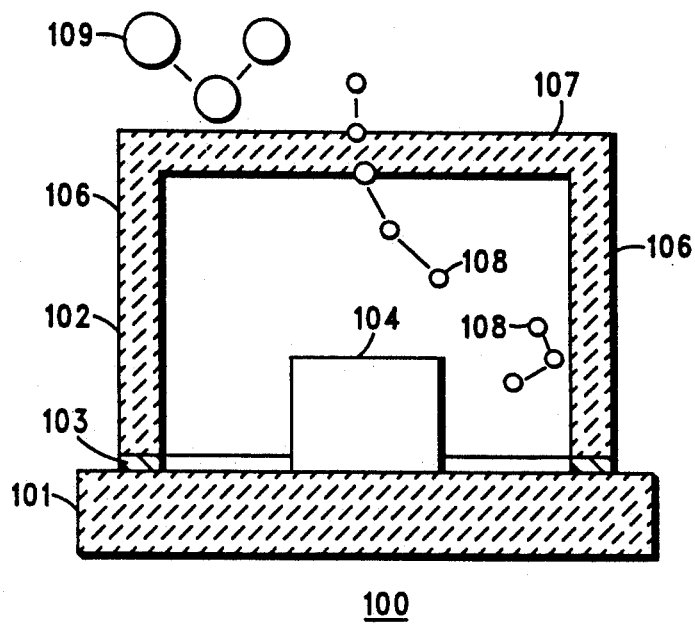
FIG. 1 comprises a sectioned side elevational view of the invention.
Figure 2:
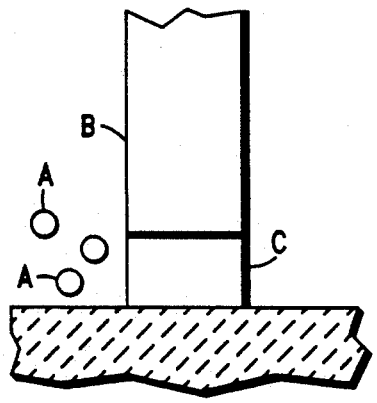
FIGS. 2-4 comprise detailed, sectioned side elevational views of the earlier described background art phenomena.
Figure 3:
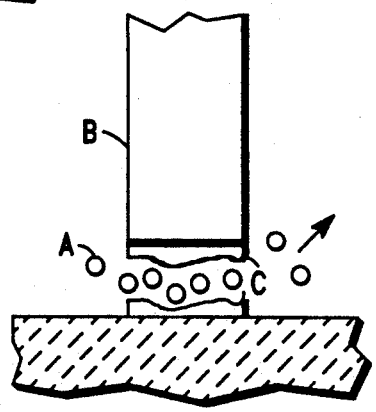
Figure 4:
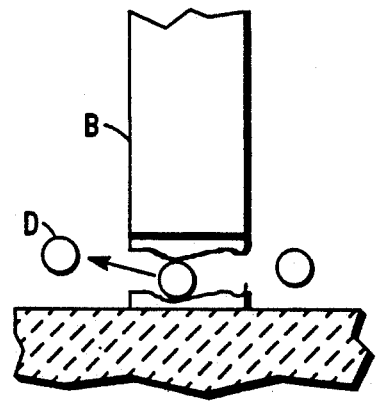

The reflow compatible device package can be seen in FIG. 1 as generally depicted by the numeral 100. The package (100) includes generally a support surface (101), a housing (102), and an attachment medium (103). These generally referred to components are configured to appropriately house an electronic device (104) such as a power transistor.

The support surface (101) may be comprised, for example, of a non-porous ceramic material or a berrylia pill that is joined to a copper flange. The electronic device (104) mounts to the support surface (101) in a manner well understood in the art.

The housing (102), in this embodiment, includes sidewalls (106) and a top (107). Although the housing (102) is comprised of an integral ceramic structure, the sidewalls (106) are formed of non-porous ceramic material and the top (107) is comprised of porous ceramic material, with both the sidewalls (106) and the top (107) being fired simultaneously.

As a result of this construction, small molecules, such as gas molecules (108), cannot readily propagate through the sidewalls (106), but can traverse the membrane top (107) in response to various atmospheric conditions such as heat induced pressure. Further, although the top (107) comprises a membrane in this regard, the top (107) still remains substantially resistant to the passage of larger molecules (109), such as liquid molecules.

The housing (102) couples to the support surface (101) through use of an appropriate adhesive (103) such as epoxy.

To form this package, the electronic device (104) is installed on the support surface (101). The housing (102) then couples to the support surface (101) through use of the adhesive (103). The adhesive is then cured (103) in an appropriate manner to secure the housing (102) to the support surface (101).

Whether the curing process includes application of heat, and regardless of subsequent heat processing (such as occurs during reflow processing), the adhesive material (103) will maintain its integrity, as the atmospheric contents of the housing (100) are free to traverse the membrane barrier provided by the top (107).

What is claimed is:

1. A package for use with an electronic device, comprising:
   A) support means for supporting the electronic device;
   B) housing means, including integrally formed sidewalls and a top, for disposition about the electronic device, wherein the sidewalls are formed of relatively non-porous ceramic material and the top is formed of relatively porous ceramic material;
   C) attachment means for coupling the housing means to the support means; wherein:
      A) the attachment means is substantially resistant to passage of gas therethrough;
      B) the top of the housing means is less resistant to passage of gas therethrough than is the attachment means, but is substantially resistant to passage of liquids therethrough.

2. A package for use with an electronic device, comprising:
   A) housing means for disposition about the electronic device;
   B) attachment means for coupling the housing means to a support surface; wherein:
      A) the attachment means is substantially resistant to passage of gas therethrough;
      B) the housing means includes integrally formed sidewalls and a top, wherein the sidewalls are formed of relatively non-porous ceramic material and the top is formed of relatively porous ceramic material, and wherein the top allows gas to pass substantially unimpeded therethrough and substantially impedes liquid from passing therethrough.

3. A method for forming an electronic device package, comprising the steps of:
A) providing a support surface;
B) disposing an electronic device on the support surface;
C) coupling a housing with adhesive to the support surface, such that the housing envelopes the electronic device, the housing including integrally formed sidewalls and a top, wherein the sidewalls are formed of relatively non-porous ceramic material and the top is formed of relatively porous ceramic material, wherein the top allows gas to pass substantially unimpeded therethrough and substantially impedes liquid from passing therethrough, and wherein the adhesive, when cured, is substantially resistant to passage of gas therethrough;
D) curing the adhesive.

* * * * *